United States Patent [19]

Lang et al.

[11] 4,419,531
[45] Dec. 6, 1983

[54] PHOTO-VOLTAIC SOLAR MODULE

[75] Inventors: Josef Lang, Regensburg; Reinhard Hollaus, Obertraubling; Ulrike Reeh, Munich; Hans Denk, Gauting; Reiner Habrich, Heimstetten, all of Fed. Rep. of Germany

[73] Assignee: Siemens Aktiengesellschaft, Berlin and Munich, Fed. Rep. of Germany

[21] Appl. No.: 396,144

[22] Filed: Jul. 7, 1982

[30] Foreign Application Priority Data

Jul. 23, 1981 [DE] Fed. Rep. of Germany ....... 3129167
Oct. 23, 1981 [DE] Fed. Rep. of Germany ....... 3142129

[51] Int. Cl.³ .......................................... H01L 31/02
[52] U.S. Cl. .................................. 136/251; 136/245; 136/259
[58] Field of Search .................. 136/245, 251, 259

[56] References Cited

U.S. PATENT DOCUMENTS

| 2,962,539 | 11/1960 | Daniel | 136/245 |
| 3,411,050 | 11/1968 | Middleton et al. | 136/245 |
| 3,565,719 | 2/1971 | Webb | 156/212 |
| 3,780,424 | 12/1973 | Forestieri et al. | 29/572 |
| 3,977,904 | 8/1976 | Köhler | 136/246 |
| 4,019,924 | 4/1977 | Kurth | 136/251 |
| 4,133,697 | 1/1979 | Mueller et al. | 136/245 |

FOREIGN PATENT DOCUMENTS 2160345 5/1973 Fed. Rep. of Germany ...... 136/245

Primary Examiner—Aaron Weisstuch
Attorney, Agent, or Firm—Herbert L. Lerner; Laurence A. Greenberg

[57] ABSTRACT

A photovoltaic solar module having at least one solar cell embedded in synthetic resin and resting on a flexible supporting element and which further includes a sheet-like rigid element reinforcing the solar cell.

18 Claims, 5 Drawing Figures

PHOTO-VOLTAIC SOLAR MODULE

The invention relates to a reinforced photo-voltaic solar module (hereinafter referred to as solar module, for short), wherein at least one solar cell is embedded in synthetic resin and rests on a supporting element.

As is generally known, solar cells must be accommodated in solar modules so that, on the one hand, the individual solar cells can be protected and, on the other hand, greater areas can be covered without having to wire the solar cells individually.

There have been several variations, heretofore, of solar modules rigid over the entire surface thereof and, therefore, also requiring rigid and flat frames. Rigid solar modules of this type cannot be adapted or accommodated to curved surfaces, a fact which considerably decreases the applicability thereof.

Reinforcement or stiffening of the solar module is an absolute necessity because without it the individual solar cells would be destroyed, especially due to breaking.

It is accordingly an object of the invention to provide a solar module wherein the solar cells are protected against bending stress yet the solar module is so flexible that it can be disposed on curved surfaces.

With the foregoing and other objects in view, there is provided, in accordance with the invention, a solar module having at least one solar cell embedded in synthetic resin and resting on a flexible supporting element, and further comprising a sheet-like rigid element reinforcing the solar cell.

In accordance with other alternative features of the invention, the supporting element is formed of a flexible material such as a web, mesh, or foil, for example.

Materially intrinsic to the invention is that the entire solar module as such is not reinforced or stiffened. Indeed, only those regions are reinforced or stiffened which are especially in jeopardy of damage. Thus, basically only the regions and areas, respectively, wherein the solar cells are provided are equipped with the areal or sheet-like rigid element. In accordance with additional features of the invention, the sheet-like rigid element covers substantially the same area as the solar cell and, together with the solar cell, partially fills the solar module.

Because the solar cells are lined with rigid material, no destructive forces are transmitted to the solar cell when the flexible supporting element is subjected to tensile, compressive or bending stress; on the other hand, the solar module may be adapted or accommodated to curvatures because of the flexible supporting element.

Due to this partial reinforcement or stiffening in the region of the solar cells, the entire solar module surface can be constructed so as to be considerably more flexible and "softer". Thus, the demands with respect to strength or stability which are made on the material used overall are decreased, with the result that the solar module can be constructed with a considerably lower outlay of material.

A further advantage of the solar module according to the invention is that module surfaces of practially any size may be constructed without any considerable increase in the specific weight per unit area.

Also in accordance with the invention, jeopardized regions other than the solar cells may be reinforced or stiffened with rigid elements. Such regions are, for example, the connections between the individual solar cells. In the regions beyond the reinforcing or stiffening elements, the unity or cohesion of the solar module is ensured by the flexible supporting element which-in accordance with yet another feature of the invention, is a metal web or mesh, for example, which is, more particularly, galvanized and protected against corrosion by a lacquer layer.

In accordance with an alternative feature of the invention, the flexible supporting element is formed of a flexible compound material e.g. a plastic web or mesh which is reinforced with glass fibers, carbon fibers, plastic fibers and the like or a foil reinforced in such manner.

Due to the invention of the instant application, it is possible to produce solar modules, with low manufacturing expense and great economization of material, which can even cover curved surfaces, such as an uneven floor, car roofs, faces of cliffs, house fronts and the like, for example.

Use of material per unit area and manufacturing or production outlay have heretofore increased with increasing size of solar modules: for example, ever thicker glasses and ever more complicated frames are required in order to achieve the required mechanical stability or strength. This interdependence of area and expense is eliminated with the invention of the instant application. Large areas can be covered with the solar module according to the invention, for a relatively low outlay of material and production or manufacturing expense. Less than a third of the material and weight, compared with previous modules of this general type, is required for the module of the invention.

The solar module according to the invention is manufacturable continuously from foils, tapes, webs, etc saturated with synthetic resin, and the like.

In the case of the invention, flexible materials formed of plastic-material foils or flexible compound materials, which fulfill various functions, are basically placed around the partially reinforced or stiffened solar cells in such manner that the desired solar modules are produced therefrom in a continuous production process. The plastic-material foils may be formed, for example, of synthetic resins which can be thermally or ultrasonically welded, under pressure, and if necessary, may be formed of adhesive foils or laminates. Also in accordance with the invention, the synthetic resin is a duroplastic molding material, an epoxy resin molding material, a polyurethane resin molding material, a silicon resin molding material, a polyester resin molding material or an acrylic resin molding material, or the synthetic resin is a thermoplastic. The duroplastic synthetic resin is producible in the casting, impregnating, laminating or coating process.

Other features which are considered as characteristic for the invention are set forth in the appended claims.

Although the invention is illustrated and described herein as embodied in a photo-voltaic solar module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings, in which.

Figure 1:
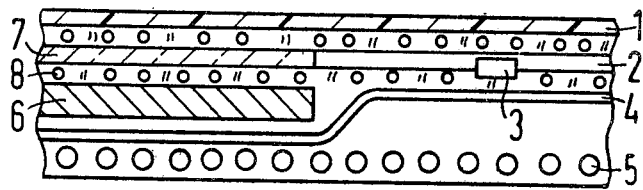
FIG. 1 is a fragmentary cross-sectional view of an embodiment of a photo-voltaic solar module constructed in accordance with the invention.

Referring now to the drawing and first, particularly, to FIG. 1 thereof, there is shown a solar cell 7 embedded in a synthetic resin 2 reinforced with a glass web 8. The glass web 8 is formed in two layers, one of which is disposed above and below the solar cell 7.

The upper side of the synthetic resin 2 is covered with a light-permeable, scratch-resistant, weather-resistant and cleansable layer 1 of synthetic resin such as of polyvinylfluoride, known under the trade name Tedlar, for example. An electrical intermediate connection 3, by means of which the individual solar cells 7 forming a solar module are connected to one another, is also additionally embedded in the synthetic resin 2. A multi-layer foil or compound foil 4 serves as a vapor diffusion block or barrier. A flexible supporting element 5 is provided below the multi-layer foil 4.

Below the solar cell 7, an areal or sheet-like rigid element, for example, a disc 6 of metal or synthetic resin, is disposed. This rigid element 6 reinforces the solar module in the vicinity of the solar cell 7 and thus, together with the flexible support 5, forms a cohesive structure or construction for the module. The flexible support 5 is adhesively joined to the multi-layer foil 4 and projects freely outwardly in the right-hand part of FIG. 1, namely in the regions without solar cells 7. The metal or synthetic resin disc 6 may also be adhesively secured to the glass web 8.

Figure 2:
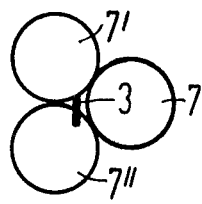
FIG. 2 is a diagrammatic top plan view of the photo-voltaic solar module of FIG. 1 greatly reduced in size over the view in FIG. 1.

FIG. 2 illustrates the mutual disposition or arrangement of individual solar cells 7, 7', 7" and the intermediate connection 3 of the module.

Figure 3:
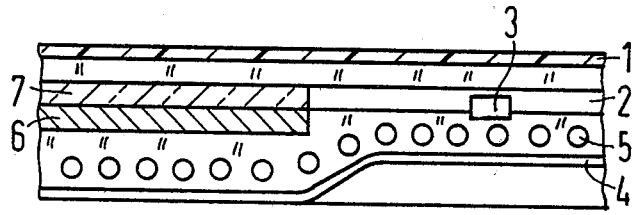
FIGS. 3 to 5 are views similar to that of FIG. 1 of three other embodiments of the invention.
Figure 4:
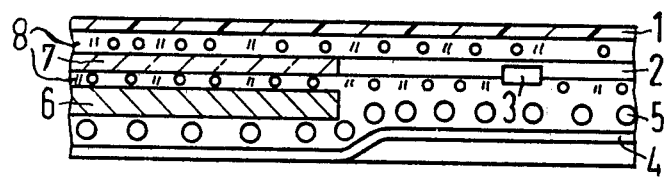
Figure 5:
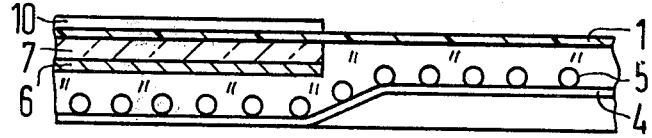

In FIGS. 3 to 5, like components are identified by the same reference numerals as in FIG. 1.

No glass web, such as the glass web 8 of the embodiment of FIG. 1, is required in the exemplary embodiment of FIG. 3. The solar cell 7 is placed upon the rigid element 6 before embedment thereof in the synthetic resin 2. The flexible support 5 is integrated with the synthetic resin 2 in the exemplary embodiment of FIG. 3.

In the embodiment of FIG. 4, there is added to the embodiment of FIG. 3, a glass web 8 in two layers arranged one above and one below the solar cell 7.

The embodiment of FIG. 5 additionally provides a thin glass layer 10 acting as added reinforcement, so that the plate 6 may be made considerably thinner or even completely dispensed with. If necessary or desirable, the thin glass layer 10 can be integrated with the synthetic-resin layer 1, so that an even surface is produced.

There is claimed:

1. A solar module having at least one solar cell embedded in synthetic resin and resting on a flexible supporting element, further comprising a sheet-like rigid element reinforcing the solar cell.

2. A solar module according to claim 1 wherein said sheet-like rigid element occupies approximately the same area as the solar cell and, together with the solar cell, partially fills the solar module.

3. A solar module according to claim 1 wherein said sheet-like rigid element is bonded with the synthetic resin surrounding the solar cell.

4. A solar module according to claim 1 wherein the supporting element is a galvanized iron wire web or mesh.

5. A solar module according to claim 4 wherein the supporting element is covered with a layer of lacquer.

6. A solar module according to claim 1 including a multi-layer foil serving as a vapor diffusion barrier disposed between the synthetic resin and the supporting element.

7. A solar module according to claim 1 including a glass web embedded in the synthetic resin.

8. A solar module according to claim 7 wherein said glass web extends in respective layers above and below the solar cell.

9. A solar module according to claim 1 including a plurality of solar cells, and means for electrically connecting said solar cells, said connecting means being embedded in the synthetic resin.

10. A solar module according to claim 1 including a light-permeable synthetic resin layer applied to a surface of the synthetic resin facing away from the solar cell.

11. A solar module according to claim 1 wherein said sheet-like rigid element is formed of metal, synthetic resin or compound material.

12. A solar module according to claim 1 wherein the solar cell is disposed on said sheet-like rigid element.

13. A solar module according to claim 1 including a thin glass layer disposed in a region above the solar cell.

14. A solar module according to claim 1 wherein the synthetic resin is a duroplastic molding material.

15. A solar module according to claim 1 wherein the synthetic resin is a molding material formed of epoxy resin, polyurethane resin, silicone resin, polyester resin or acrylic resin.

16. A solar module according to claim 1 wherein the synthetic resin is duroplastic and formed in a casting, impregnating, laminating or coating process.

17. A solar module according to claim 1 wherein the synthetic resin is a thermoplastic.

18. A solar module according to claim 1 wherein the synthetic resin is formed of thermally weldable foils.

* * * * *